United States Patent [19]
Hsieh

[11] Patent Number: 5,838,175
[45] Date of Patent: Nov. 17, 1998

[54] LOW DISTORTION TRACK AND HOLD CIRCUIT

[75] Inventor: Kuo-Chiang Hsieh, Palo Alto, Calif.

[73] Assignee: Hewlett-Packard Company, Palo Alto, Calif.

[21] Appl. No.: 795,222

[22] Filed: Feb. 5, 1997

[51] Int. Cl.$^6$ .................................................. G11C 27/02
[52] U.S. Cl. ................................ 327/94; 327/92; 327/96
[58] Field of Search .................................. 327/91, 92–94, 327/96; 341/122–125

[56] References Cited

U.S. PATENT DOCUMENTS

| | | | |
|---|---|---|---|
| 4,879,478 | 11/1989 | Gershon ..................................... | 327/92 |
| 5,036,219 | 7/1991 | Dingwall et al. ........................ | 327/92 |
| 5,243,235 | 9/1993 | Wakayama et al. ...................... | 327/92 |
| 5,313,113 | 5/1994 | Linder ....................................... | 327/92 |

OTHER PUBLICATIONS

R. Jewett et al., "WP 2.3: A 12b 20MS/s Ripple–through ADC," 1992 IEEE International Solid–State Conference, Digest of Technical Papers (pp. 34–35), 1992.

*Primary Examiner*—My-Trang Nu Ton

[57] ABSTRACT

A low distortion track-and-hold circuit in which a simple, four-transistor amplifier makes the circuit characteristics independent of the source impedance, and compensates for unequal voltage drops caused by mismatched diodes. An additional pair of bipolar transistors is used to eliminate errors caused by switching transients coupled through the diodes. In the track mode, the differential output voltage between two sampling capacitors tracks the differential input voltage of the circuit. At the end of the track time, this differential output voltage is equal to the differential input voltage. During the hold period, the sampling capacitors are isolated from the differential input voltage. The voltages controlling the switching diodes reverse symmetrically during the transition from track to hold, resulting in a cancellation of any feedthrough of the switching transients to the sampling capacitor. Beta and temperature compensation circuits are also included in the differential track-and-hold circuit. In a single-ended in and single-ended out configuration, an operational amplifier can be used to provide a unity-gain buffer and the correct voltage offset. The invention may be implemented using bipolar transistors, MOSFET and JFET technologies.

16 Claims, 7 Drawing Sheets

LOW DISTORTION TRACK AND HOLD CIRCUIT

BACKGROUND OF THE INVENTION

1. Technical Field

The invention relates to electronic circuits. More particularly, the invention relates to a track and hold circuit having gain control and temperature compensation for voltage transients, source impedance and diode mismatching to provide a precisely held output voltage.

2. Description Of the Prior Art

Sample-and-hold ("SHC") and track-and-hold ("THC") circuits have been widely used in analog signal processing systems such as analog-to-digital converters. An SHC samples only one point of a signal and then holds it. A THC tracks a signal through a period of time that will be called the track time and holds the value of the signal at the end of the track time for a time that will be called the hold time.

A THC is frequently used to provide input signal conditioning for an analog-to-digital converter. An analog signal can vary continuously over a period of time, and over the entire spectrum of signal frequencies. Some types of analog-to-digital converter ("ADC") are not effective when fed with such a continuously-changing input signal. The ADC functions effectively when provided with a signal whose level remains constant for discrete periods of time. Thus, a continuously varying analog signal representing an information signal must be converted to a step-by-step signal, with each step being a representation of the analog waveform at a particular time. This is accomplished by using a THC.

The THC tracks the analog signal and a clock signal determines certain times at which the signal is to be held and sampled. This process is repeated rapidly throughout the entirety of the analog signal. Distortion is introduced into the signal when it is under-sampled. Thus, the sampling rate must be sufficiently high to accurately quantize the continuous-valued amplitude of the analog signal into a discrete-valued representation.

Figure 1:
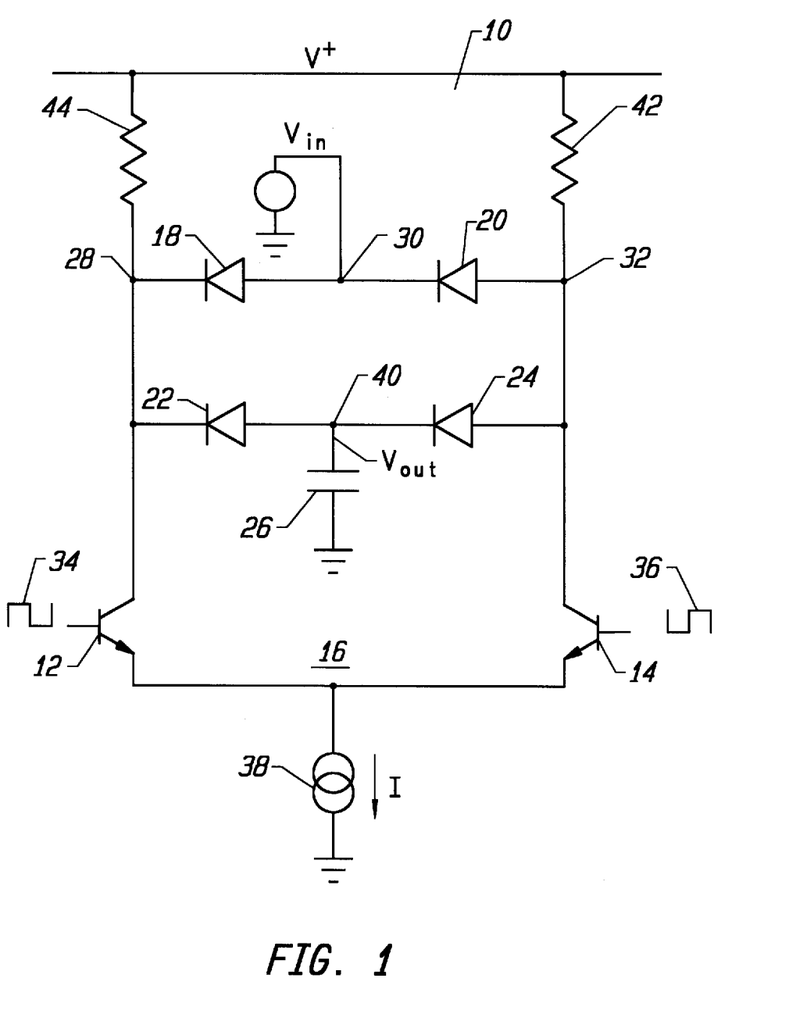
FIG. 1 is a circuit diagram of a conventional track-and-hold circuit.

FIG. 1 is a circuit diagram of a conventional track-and-hold circuit 10, according to the prior art. Four diodes 18, 20, 22, 24 are arranged in a bridge configuration and function as pass/block devices. A single-ended input voltage $V_{in}$ is connected the node 30 of the diode bridge 18–24. A sampling capacitor 26 is connected the node 40, opposite the node 30. A current switch 16, formed of a differential pair of bipolar transistors 12, 14, is connected to the nodes 28 and 32, opposite one another. Current from the current source 38 flows through the switch to resistors 42 and 44 connected to the nodes 30 and 40. The single-ended output voltage $V_{out}$ is accumulated on the sampling capacitor 26.

The input signal $V_{in}$ is a voltage source. The output signal $V_{out}$ is in the form of a track-and-hold of $V_{in}$. Antiphase clock signals 34 and 36 are applied at the bases of transistors 12 and 14, respectively. When clock signal 34 exceeds clock signal 36, the circuit operates in the track mode. In this mode, transistor 12 is switched on and transistor 14 is off. Current I therefore flows through transistor 12 and resistor 44 and turns on the four diodes. The voltage drop across the diode string 18–20 is the same as that across diode string 22–24. If all the diodes have the same I–V characteristics, the diodes must each have the same voltages across their cathode-anode. This produces the same voltage at nodes $V_{in}$ and $V_{out}$.

When the clock signal 36 exceeds the clock signal 34, transistor 12 is turned off and transistor 14 is turned on to place the circuit in the hold mode. The current I flows through transistor 14 and resistor 42. The voltage at node 32 thus drops below the voltage at node 28. This voltage drop shuts off or reverse-biases the four diodes, so that the voltage at the anode side of each diode is lower than that at the cathode.

This blocks the conducting path from $V_{in}$ to $V_{out}$. The voltage $V_{out}$ at the end of the tracking period is held by the capacitor 26 until the start of next tracking period. This is the holding process. The track-and-hold signal is then ready for further analysis by the following circuits.

The diode bridge circuit of FIG. 1 is subject to several problems. A first problem is that the accuracy of the circuit is dependent upon the four diodes having identical forward characteristics. However, when the voltage drops across the diodes in the diode strings 18–20 and 22–24 are different, the output voltage $V_{out}$ at node 40 will be different from the input voltage $V_{in}$ at node 30 and an error will result.

A second potential source of error is the source impedance of the input signal. The voltage across diode 18 and, hence, the slope resistance of the diode is a function of the level of the input voltage. A non-ideal voltage source $V_{in}$ has a finite source impedance. When the voltage source $V_{in}$ is connected to $V_{out}$ through non-linear elements, such as diodes, the finite source impedance reduces the value of $V_{out}$. Therefore, the voltage difference from $V_{in}$ to $V_{out}$ is also signal dependent.

A final problem arises during the transition between track and hold modes. During such transition, the current I switches from transistor 12 to transistor 14. This switching produces voltage transients at nodes 28 and 32. These transients are in opposite directions, but have different amplitudes and rates of change. The diodes 18–24 have capacitance that couple the transients to the sampling capacitor 26. A fast transient coupled through the diode capacitance will produce a larger change in the voltage at the sampling capacitor 26 than a slow transition of the same amplitudes. Because the switching transients are asymmetrical, coupling of the transients to the sampling capacitor will result in a net change in the voltage stored on the capacitor. This net change in the capacitor voltage causes an error in the output voltage $V_{out}$. For example, when transistor 12 is on, the voltage at node 28 equals $V_{in}$ minus the voltage drop across diode 18. If the $V_{in}$ is high, then node 28 is high, and if the $V_{in}$ is low, node 28 is low. During the track mode, the voltage at node 32 is higher than $V_{in}$ by the voltage drop across diode 20. However, the voltage at node 32 remains constant during the hold mode. The nodes 28 and 32 therefore have different voltage swings at the track-to-hold transition. Moreover, the voltage at node 32 changes faster than the voltage at node 28 during the transition from track to hold. Thus, even if diodes 22 and 24 have identical forward characteristics, the transients feeding through into the sampling capacitor are asymmetrical, and therefore change the value of $V_{out}$.

It would therefore be an advantage to provide a track-and-hold circuit that reduced or entirely eliminated distortion resulting from voltage transients caused by differing voltage swings, finite source impedance, and unequal voltage transitions caused by mismatched diodes. It would be a further advantage if such track-and-hold circuit compensated for variations in both beta and temperature.

SUMMARY OF THE INVENTION

The invention provides a low distortion track-and-hold circuit. An amplifier is used to make circuit operation independent of the source impedance, and to compensate for unequal voltage drops caused by mismatched diodes. A pair of bipolar transistors is used to eliminate transient voltages caused by differing voltage drops. The track-and-hold circuit has beta and temperature compensation and is adapted for uses including analog-to-digital signal conversion.

In a preferred embodiment of the invention, a dynamic resistive load includes a diode bridge having first and second diode strings and opposing first and second nodes. A sampling capacitor is connected to a third node formed between the diodes of the first diode string. First and second resistors are connected between the first and second nodes, respectively, and a supply voltage.

During the track mode, switches connect a current generated by a differential pair to the diode bridge to turn on the first diode string. The differential output voltage at the sampling capacitor therefore tracks the differential input voltage of the circuit. At the end of the track mode, this differential output voltage is equal to the differential input voltage at the end of the track time.

In the hold mode, switches dump the currents generated by the differential pair. The held differential voltage is applied differentially through a unity-gain buffer to the input of a replica circuit including a replica differential pair. The currents generated by the replica differential pair reverse-bias the first diode string and turn on a second diode string. The sampling capacitor is thereby isolated from the differential input voltage. The held differential voltage during the hold period is equal to the differential voltage at the end of the track time.

The currents generated by the replica differential pair during the hold mode are identical to the currents generated by the differential pair at the end of the track mode. Thus, the voltage between the first and second nodes reverses symmetrically during the transition from track to hold.

These symmetrical voltage swings result in any feedthrough of the switching transient cancelling at the third node. Thus, there is no voltage change at the sampling capacitor during the track to hold transition.

This differential track-and-hold circuit includes transistors and resistors for beta and temperature compensation. A resistor at the base current input of a transistor adds an additional base-to-emitter voltage drop to provide beta compensation to the circuit. The base-to-emitter voltage terms are canceled to provide temperature compensation for the circuit.

The circuit may also be implemented as a single-ended in and single-ended out configuration. In such single-ended configuration, an operational amplifier can be used to provide a unity gain buffer and the correct voltage offset.

The invention is readily adapted for uses including instrumentation, sound and video production, and analog-to-digital signal conversion. The track-and-hold circuit may be implemented using bipolar transistors, MOSFET and JFET technologies.

DETAILED DESCRIPTION OF THE INVENTION

The invention provides a low distortion track-and-hold circuit. A pair of bipolar transistors is used to eliminate voltage transients caused by differing voltage swings. An amplifier is used to make circuit operation independent of the source impedance, and to compensate for unequal voltage drops caused by mismatched diodes.

One factor in the performance of circuits having transistors is known as beta. Beta is a term representing the ratio of the collector current to the base current of a bipolar transistor. Beta compensation techniques are used to ameliorate any changes in circuit performance resulting from the beta.

Circuits such as a THC are also subject to fluctuations in temperature. As the environment in which the circuit operates changes, the characteristics of the devices change in response to the temperature changes. Temperature compensation techniques are used to maintain linearity through a wide temperature range.

A track-and-hold circuit requires an accurate voltage relationship among its elements to function properly. A simple amplifier is not sufficient to provide such accuracy because the characteristics of a simple amplifier change as the result of beta and temperature variations in the circuit. An amplifier circuit implementing both temperature and beta compensation is described in R. Jewett, et al., A 12b 20MS/s Ripple-through ADC, 1992 ISSCC Digest of Technical Papers, pp 34–35. Jewett places a resistor at the base of a transistor in a gain-of-two amplifier. The resistor is adjusted to compensate for beta and temperature variations. The invention uses the same technique to achieve the required precision.

Figure 2:
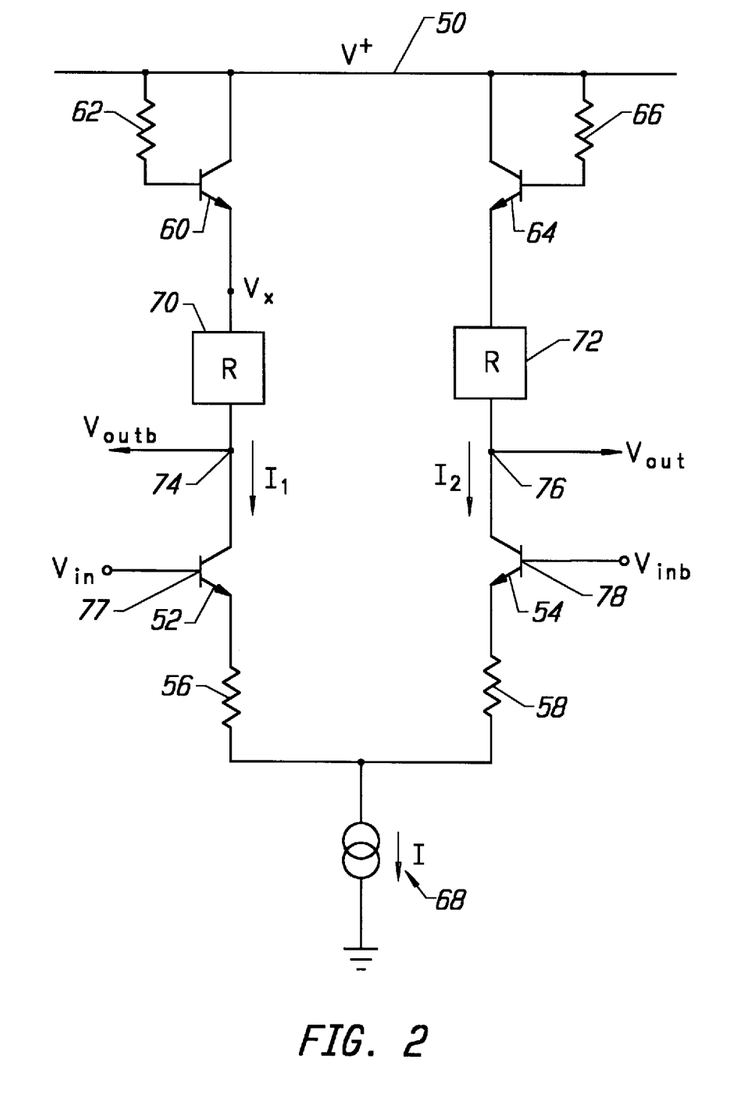
FIG. 2 is a circuit diagram of a precision gain-of-one beta and temperature compensated differential amplifier used in the track and hold circuit according to the present invention.

FIG. 2 is a circuit diagram of a precision gain-of-one beta and temperature compensated differential amplifier 50 used in the track and hold circuit according to the present invention. Transistors 52 and 54 each have an associated emitter resistor 56, 58. To produce a linear voltage transfer from the input voltage to the output voltage, compensation must be provided for the non-linear base-to-emitter characteristics of these two transistors. A DC bias current 68 is also provided.

Transistor 60 and its base resistor 62 act as $V_{be}$ and beta compensations, respectively, for transistor 52 and its base current, when the output is at node 74. Transistor 64 and its base resistor 66 have a similar effect at the output node 76. A resistive load 70 is connected to the collector of transistor 52, and a similar resistive load 72 to the collector of transistor 54. These two resistive loads and resistors 56 and 58 set the voltage gain of this circuit.

The voltage $V_{outb}$ at node 74 is:

$$V_{outb} = V_x - (I_1 \cdot R_{c1})$$

where $V_x$ is the voltage at the emitter of transistor 60;

$R_{c1}$ is the value of the resistive load 70, $R_{c2}$ is the value of resistive load 72, and $R_c = R_{c1} = R_{c2}$; and $I_1$ and $I_2$ are the currents through the resistive loads 70 and 72, respectively.

For a gain of one amplifier, the value of resistors 56 and 58 is equal to $R_c$. The differential output current of the circuit is:

$$I_1-I_2=(V_{in}-V_{inb})/R_c-(V_{be1}-V_{be2})/R_c \quad (1)$$

where $V_{in}$ is the input voltage at the base 77 of transistor 52;

$V_{inb}$ is the input voltage at the base 78 of transistor 54; and $V_{be1-2}$ are the base-to-emitter voltages of transistors 52 and 54, respectively.

The differential output voltage is:

$$\begin{aligned}V_{out}-V_{outb} &= (V^+-(I_2/\beta \cdot R_{b4})-V_{be4}-(I_2 \cdot R_c))- \\ &\quad (V^+-(I_1/\beta \cdot R_{b3})-V_{be3}-(I_1 \cdot R_c)) \\ &= ((I_1-I_2)\cdot R_c)-(V_{be4}-V_{be3})+((I_1-I_2)/\beta)\cdot R_b \\ &= (V_{in}\cdot V_{inb})-(V_{be1}-V_{be2})+(V_{be3}-V_{be4})+ \\ &\quad ((I_1-I_2)/\beta)\cdot R_b \end{aligned} \quad (2)$$

where $V_{outb}$ is the output voltage at node 74;

$V_{out}$ is the output voltage at node 76;

$R_{b3}$ is the value of the base resistor 62, $R_{b4}$ is the value of the base resistor 66, where $R_b=R_{b3=Rb4}$;

$\beta$ is the ratio of the collector current to the base current of the transistors 60 and 64; and $V_{be1-4}$ are the base-to-emitter voltages for transistors 52, 54, 60 and 64, respectively.

The collector current of 60 differs from that of transistor 52 by the value of the base current of transistor 60. The value of the base resistor 62 of transistor 60 is:

$$R_{b3}=\beta\cdot(V_{be1}-V_{be3})/I_1 \quad (3)$$

A similar compensation occurs with the transistors 54 and 64. In this case, the collector current of transistor 64 differs from that of transistor 54 by the value of the base current of transistor 64. The value of the base resistor 66 is:

$$R_{b4}=\beta\cdot(V_{be2}-V_{be4})/I_2 \quad (4)$$

This provides the beta compensation for the circuit.

The final relationship between the input and the output is:

$$\begin{aligned}V_{out}-V_{outb} &= (V_{in}-V_{inb})-(V_{be1}-V_{be2})+(V_{be3}-V_{be4})+ \\ &\quad ((I_1-I_2)/\beta)\cdot R_b \\ &= (V_{in}-V_{inb})-(V_{be1}-V_{be2})+(V_{be3}-V_{be4})+ \\ &\quad (V_{be1}-V_{be3})-(V_{be2}-V_{be4}) \\ &= V_{in}-V_{inb} \end{aligned} \quad (5)$$

Transistor base-to-emitter voltages are strongly temperature dependent. Therefore, the cancellation of the $V_{be}$ terms shown above has the effect of providing compensation for the temperature and its variations in the input differential pair.

Figure 3:
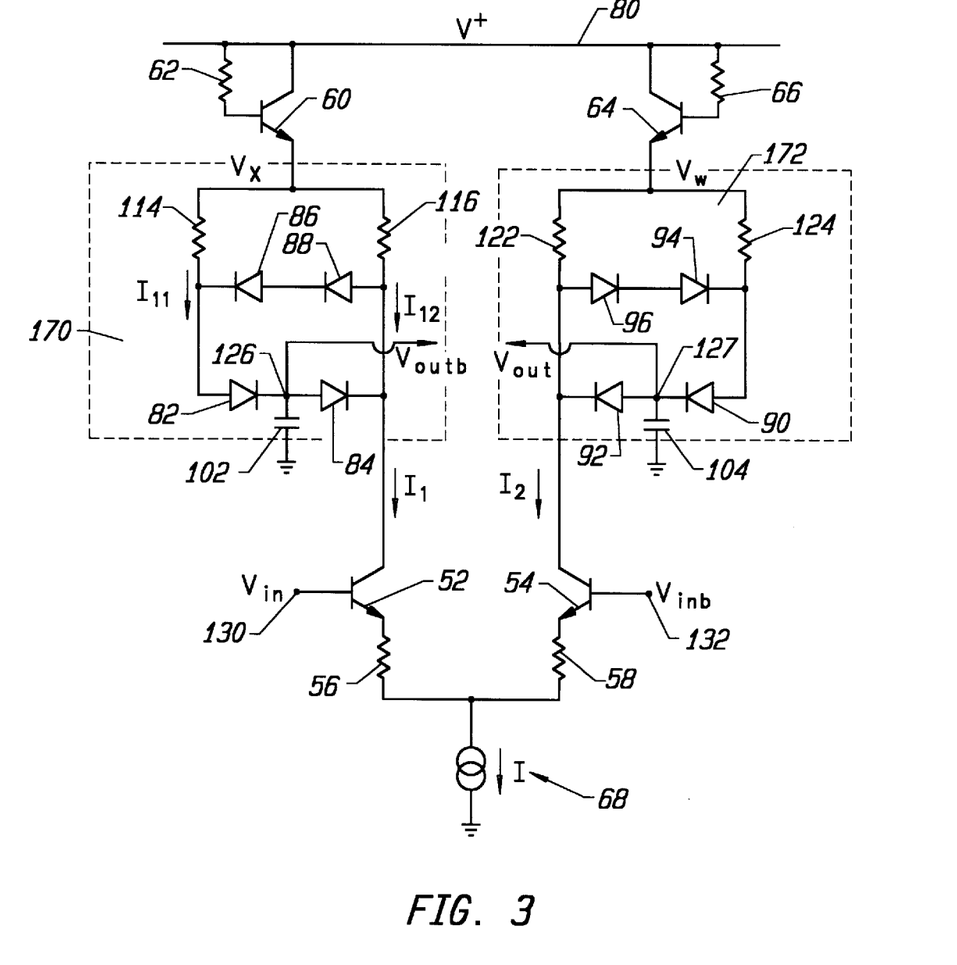
FIG. 3 is a circuit diagram of a track-and-hold circuit in the track mode according to the invention.

FIG. 3 is a circuit diagram of a track-and-hold circuit 80 in the track mode, according to the invention. This circuit is adapted for use at the input of an analog-to-digital converter (ADC). However, one skilled in the art will readily appreciate that the track-and-hold circuit of FIG. 3 may be used in any other appropriate application.

In the circuit of FIG. 3, the dynamic resistive loads 170, 172 between transistors 60 and 52, and transistors 64 and 54, respectively, are constructed differently from the resistive loads shown in FIG. 2.

At the emitter of transistor 60, current $I_1$ is divided into two paths through dynamic resistive load 170. Current $I_{11}$ passes through resistor 114 and current $I_{12}$ through resistor 116. Pass/block diode strings 82–84 and 86–88 join the two current paths. In the track mode, diode string 86–88 is reverse-biased and the diodes are turned off. Diodes 86 and 88 are turned on in the hold mode (shown in FIG. 4). Thus, in the track mode, current $I_{11}$ is conducted through diode string 82–84 to a sampling capacitor 102 connected to the node 126 between the diodes.

Since the resistors 114 and 116 are equal to each other, with each having a resistance of 2R, and equal currents pass through the diodes 82 and 84, the output voltage $V_{outb}$ at node 126 is calculated as follows:

$$R_1=R_2=2R$$

$$I_1=I_{11}+I_{12}$$

$$Vd_1=Vd_2$$

$$V_{outb}=V_x-I_{11}\cdot R_1-V_{d1}$$

$$V_{outb}=V_x-I_{12}\cdot R_2+V_{d2}$$

$$2V_{outb}=2V_x-(I_{11}+I_{12})\cdot R_1$$

$$V_{outb}=V_x-(I_1\cdot R) \quad (6)$$

where $R_1$ is the value of resistor 114;

$R_2$ is the value of resistor 116;

$I_1$ is the current through the dynamic resistive load 170;

$I_{11}$ is the current through resistor 114;

$I_{12}$ is the current through resistor 116;

$V_{d1}$ and $V_{d2}$ are the forward voltages of diodes 82 and 84, respectively; and $V_x$ is the voltage at the top of the dynamic resistive load 170.

Similarly, the current $I_2$ through dynamic resistive load 172 is also divided into two paths. Pass/block diodes 94, 96 are reverse-biased in the track mode, and the current passes through diode string 90–92 to the sampling capacitor 104 at a node between the diodes. Resistors 114=116=122=124= 2R. The voltage $V_{out}$ at node 127 is:

$$V_{out}=V_w-(I_2\cdot R) \quad (7)$$

where $I_2$ is the current through the dynamic resistive load 172; and $V_w$ is the voltage at the top of the dynamic resistive load 172.

Thus, the voltage at each sampling capacitor 102, 104 is calculated by treating each entire dynamic resistive load like one single resistor with the value of R. This gives the same input-to-output relation as that obtained from the circuit of FIG. 2.

The differential output voltage ($V_{out}-V_{outb}$) is precisely equal to the differential input voltage ($V_{in}-V_{inb}$). If there is a mismatch between diodes 82 and 84, for instance, the voltages across 82 and 84 are equal to:

$$V_{d1}=V_T\cdot 1n(I_{11}/I_{s1}),$$

and $$V_{d2}=V_T\cdot 1n(I_{11}/I_{s2}) \quad (8)$$

where $V_T$ is the volt-equivalent of temperature, $k\cdot T/q$;

k is the Boltzmann constant;

T is the absolute temperature in degrees Kelvin;

q is the charge on an electron; and $I_{s1}$ and $I_{s2}$ are the diode saturation currents for 82 and 84, respectively.

The voltage $V_{outb}$ becomes:

$$V_{outb}=V_x-I_1\cdot R+\tfrac{1}{2}V_T\cdot ln(I_{s1}/I_{s2}) \qquad (9)$$

The mismatch factor ($I_{s1}$ and $I_{s2}$) is in a logarithmic term and is not signal dependent. Its only effect is to add a DC offset to $V_{outb}$. Any mismatch between diodes 90 and 92 causes the same effect on $V_{out}$.

As explained above with regard to FIG. 2, beta compensation and temperature compensation are achieved by including transistors 60 and 64, and also the base resistors 62, 66. The resistors 56, 58 are connected to the current generator 68.

The preferred embodiment of the invention is implemented using a differential circuit. A differential circuit is advantageous because many of the non-linearities inherent to such circuit cancel each other out. However, one skilled in the art will readily appreciate that the invention may also be implemented with other circuit configurations. A differential circuit is preferred in high-precision applications as a way of stabilizing a load on the power supply.

For example, in a differential pair, the current through the positive power supply to the negative power supply is always constant. The half-circuit of the circuit shown in FIG. 3 contains only transistor 60 and its associated resistor 62, dynamic resistive load 170, transistor 52 and its associated resistor 56. The bias current source 68 is not used. The bottom node of emitter resistor 56 is connected to a negative power supply. In such single-ended circuit, a higher signal draws more current from the positive power supply V+ to the negative power supply. This may produce undesired current coupling to the line that connects V+ to a real power supply and cause the voltage of V+ to change according to the signal level, thereby degrading the signal accuracy.

The circuit shown in FIG. 3 shows only the track mode. A switch (not shown) is used to switch the circuit from track to hold mode. The hold mode is described in further detail in the discussion of FIG. 4, below.

In the track-and-hold circuit shown in FIG. 3, the input voltage $V_{in}$ must be established relative to a positive reference voltage for the circuit to work. The movement about this reference voltage can then be tracked. $V_{out}$ and $V_{outb}$ are symmetrical differential signals. Both $V_{out}$ and $V_{outb}$ have the same DC level, the same ac level and opposite ac phase. $V_{out}$ and $V_{outb}$ are used together to drive a following circuit with a differential input. Alternately, $V_{out}$ or $V_{outb}$ alone can be used to drive a circuit with a single-ended input.

Figure 4:
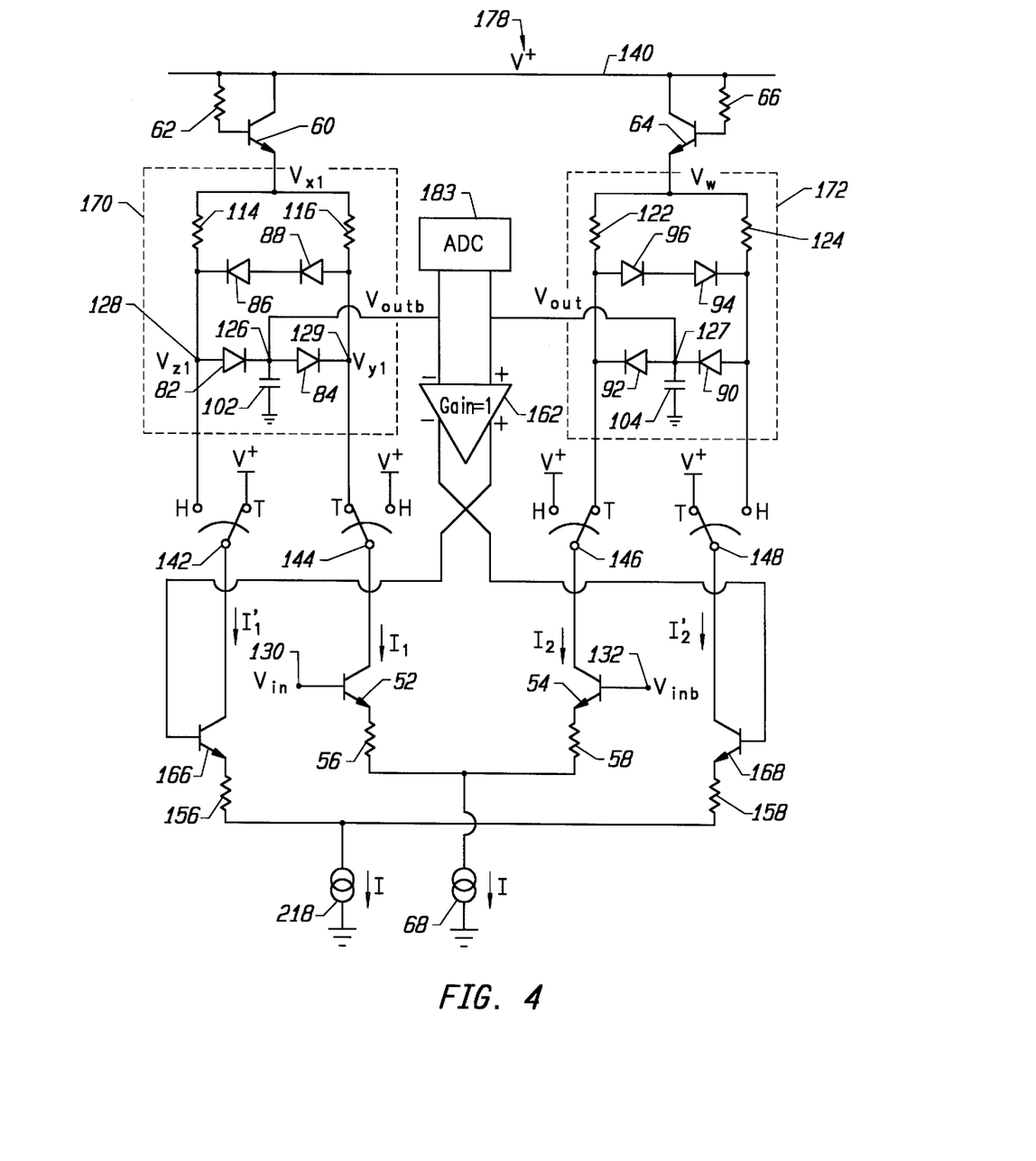
FIG. 4 is a circuit diagram of a complete differential track-and-hold circuit according to the invention.

FIG. 4 is a circuit diagram of a complete differential track-and-hold circuit 140, according to the invention. This circuit is adapted for use at the input of an analog-to-digital converter (ADC). In such application, the ADC 183 is connected to the circuit at the nodes 126 and 127. In the figure, switches 142, 144, 146, 148 switch between a track mode (T) and a hold mode (H). These current switches can be implemented using any suitable type of switch, such as a differential pair, a MOS switch, or a mechanical switch.

This differential track-and-hold circuit includes resistors 62, 66 for beta compensation. The $V_{be}$ terms are canceled as shown above with regard to FIGS. 2 and 3 to provide temperature compensation for the circuit. Dynamic resistive loads 170, 172 are constructed the same as the comparable resistive loads described in FIG. 3.

To preserve the integrity of the held voltage at the sampling capacitors 102, 104, during the transition from track to hold, the coupling of the transitions of the voltages $V_{y1}$ and $V_{z1}$ at nodes 129 and 128 into capacitor 102 must be kept at a minimum. To accomplish this, the voltage transitions at nodes 128 and 129 are made equal and opposite by drawing equal currents from these nodes in the hold and track modes, respectively. Thus, the current $I_1'$, which turns on the diodes 86 and 88 in the hold mode is made equal to the current $I_1$ that turns on diodes 82 and 84 in the track mode.

To achieve this current equality, the circuit additionally includes a unity-gain buffer 162 and a replica circuit that includes the replica differential pair 166 and 168. Any appropriate unity-gain buffer, such as a simple emitter follower, can be used. The replica circuit has the same configuration, transistor size, and resistor values as the original circuit composed of transistors 52 and 54, resistors 56 and 58, and current generator 68. The replica differential pair comprises transistors 166, 168, the resistors 156, 158 and the current generator 218. The differential pair and the replica pair are biased with equal currents I generated by the two current generators 68, 218.

In the track mode, two switches 142, 148 connect the collectors of transistors 166 and 168 to the V+ power supply 178, thereby dumping the currents $I_1'$ and $I_2'$. Resistors 156 and 158 are connected to the emitters of transistors 166 and 168, respectively. Also, the switch 144 isolates the collector of transistor 52 from the power supply 178 and connects the collector of transistor 52 to the dynamic resistive load 170 so that current $I_1$ flows through diodes 82 and 84 and resistors 114 and 116 of the dynamic resistive load. Diodes 82 and 84 are thereby turned on. Similarly, the switch 146 isolates the collector of transistor 54 from the power supply 178 and connects the collector of transistor 54 to the dynamic resistive load 172 so that current $I_2$ flows through diodes 94 and 96 and resistors 122 and 124 of the dynamic resistive load. Resistors 114, 116, 122, and 124 each have the value 2R.

The differential input voltage driving the differential pair 52 and 54 during the track mode is $V_{in}-V_{inb}$, the voltage difference between the nodes 130 and 132. At the end of the track time, the differential output voltage is $V_{out}-V_{outb}$, the voltage difference between the output nodes 126 and 127. This differential output voltage $V_{out}-V_{outb}$ is equal to the differential input voltage $V_{in}-V_{inb}$ at the end of the track time.

In the hold mode, the switches 144, 146 connect the collectors of transistors 52 and 54 to the V+ power supply 178, thereby dumping the currents $I_1$ and $I_2$. The currents $I_1$ and $I_2$ are therefore sourced from the power supply 178. The switches 142, 148 isolate the collectors of transistors 166 and 168 from the power supply.

The held differential output voltage $V_{out}-V_{outb}$ is applied differentially through the unity-gain buffer 162 to the input of the replica pair 166, 168 and generates currents $I_1'$ and $I_2'$ that turn on diode string 86–88 and 94–96, respectively. Diodes 82, 84 and 90, 92 are reverse-biased which isolates the sampling capacitors 102, 104 from transistors 52 and 54, respectively. The held differential voltage during the whole hold time is equal to the differential voltage at the end of the track time.

During the hold time, the currents $I_1'$ and $I_2'$ are equal to the currents $I_1$ and $I_2$, respectively, at the end of the track time. Thus, the voltage difference between nodes 128 and 129 reverses symmetrically during the transitions from track to hold. These symmetrical voltage swings in opposite directions at nodes 128 and 129 result in a net cancellation of the voltage transients fed through to node 126. Thus, there is no voltage change at node 126 during the track to hold transition, and the output voltage $V_{outb}$ remains unchanged by the track-to-hold switching transient. A similar effect occurs at node 127.

Figure 5:
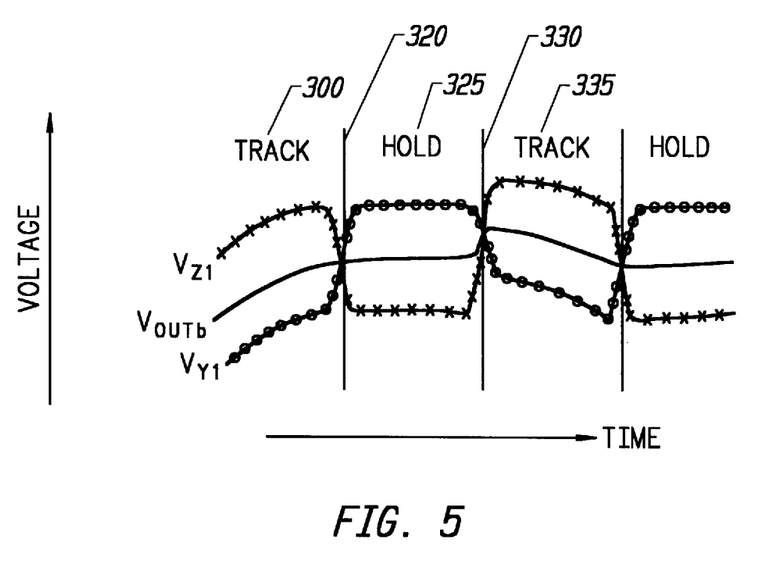
FIG. 5 is a graph of voltage versus time for the mode transitions of the differential track-and-hold circuit according to the invention.

FIG. 5 is a graph of voltage versus time for the mode transitions of the circuit of FIG. 4. During an initial track time 300, the voltages $V_{z1}$ and $V_{y1}$ at nodes 128 and 129, and the output voltage $V_{outb}$ at node 126 increase proportionately. At the transition 320 to the hold mode 325, the voltages at nodes 128 and 129 reverse symmetrically. During the hold time, the voltage at node 126 remains equal to the voltage at the end of the track time.

At the transition 330 to the next track mode 335, the voltages at nodes 128 and 129, and, hence, the voltage at node 126, depend on the new value of $I_1$, which, in turn, depends on the new value of the input voltage $V_{in}$. The symmetrical voltage swings described above continue through the alternating track and hold cycles.

Figure 6:
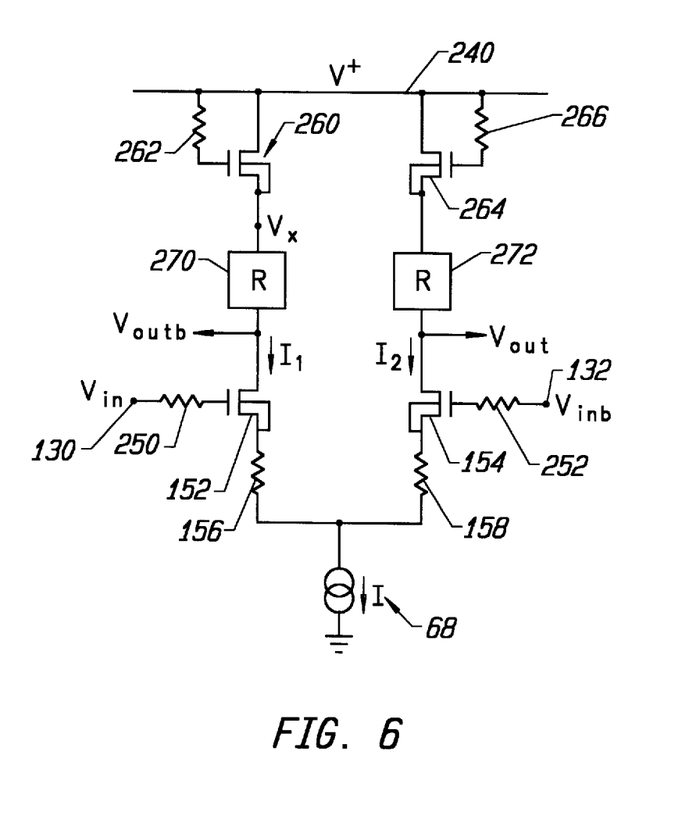
FIG. 6 is a circuit diagram of a MOSFET differential amplifier according to the invention.

Although the invention is described herein with reference to the preferred embodiment, one skilled in the art will readily appreciate that other applications may be substituted for those set forth herein without departing from the scope of the present invention. While the preferred implementation is with bipolar devices, it is possible to apply the circuit design technique of the invention to other technologies such as MOSFET or JFET technologies. FIG. 6 is a circuit diagram of a MOSFET differential amplifier 240, according to the invention.

While a MOSFET does not have a beta, in the sense of a bipolar transistor, a. gate current is produced in a MOSFET operating at high frequency. Such gate current can be analogized to the base current of a bipolar transistor. Thus, for the purposes of this discussion, a MOSFET device will be assumed to have a beta which is defined as the ratio of drain current to gate current.

The gate to source voltage $V_{gs}$ of a MOSFET can also be considered analogous to the $V_{be}$ of a bipolar transistor. For the purposes of this discussion, the term $V_{be}$ will be used to refer to the $V_{be}$ of a bipolar transistor and the $V_{gs}$ of a MOSFET.

The source impedances of the input voltages sources at nodes 130 and 132 that generate the input voltages $V_{in}$ and $V_{inb}$ are represented by the resistors 250 and 252 respectively. The substrate of each MOSFET 152, 154, 260, 264 is connected to its source to prevent body effect. The threshold voltage of an MOSFET is a function of the voltage difference between the gate and the substrate under the drain-to-source channel.

The output voltages of the circuit are represented by $V_{out}$ and $V_{outb}$. The resistive loads of the circuit are represented by the blocks 270 and 272. The gate resistors 262, 266 of MOSFET's 260 and 264 provide beta compensation, in an analogous manner to that described above with regard to the bipolar transistors of FIG. 2. Temperature compensation is similarly provided by the cancellation of the $V_{be}$ terms such that $V_{out} - V_{outb} = V_{in} - V_{inb}$.

The resistive loads 270 and 272, and resistors 156 and 158 set the voltage gain of this circuit in an analogous manner to the circuit of FIG. 2. A DC bias is supplied by current source 68.

Figure 7:
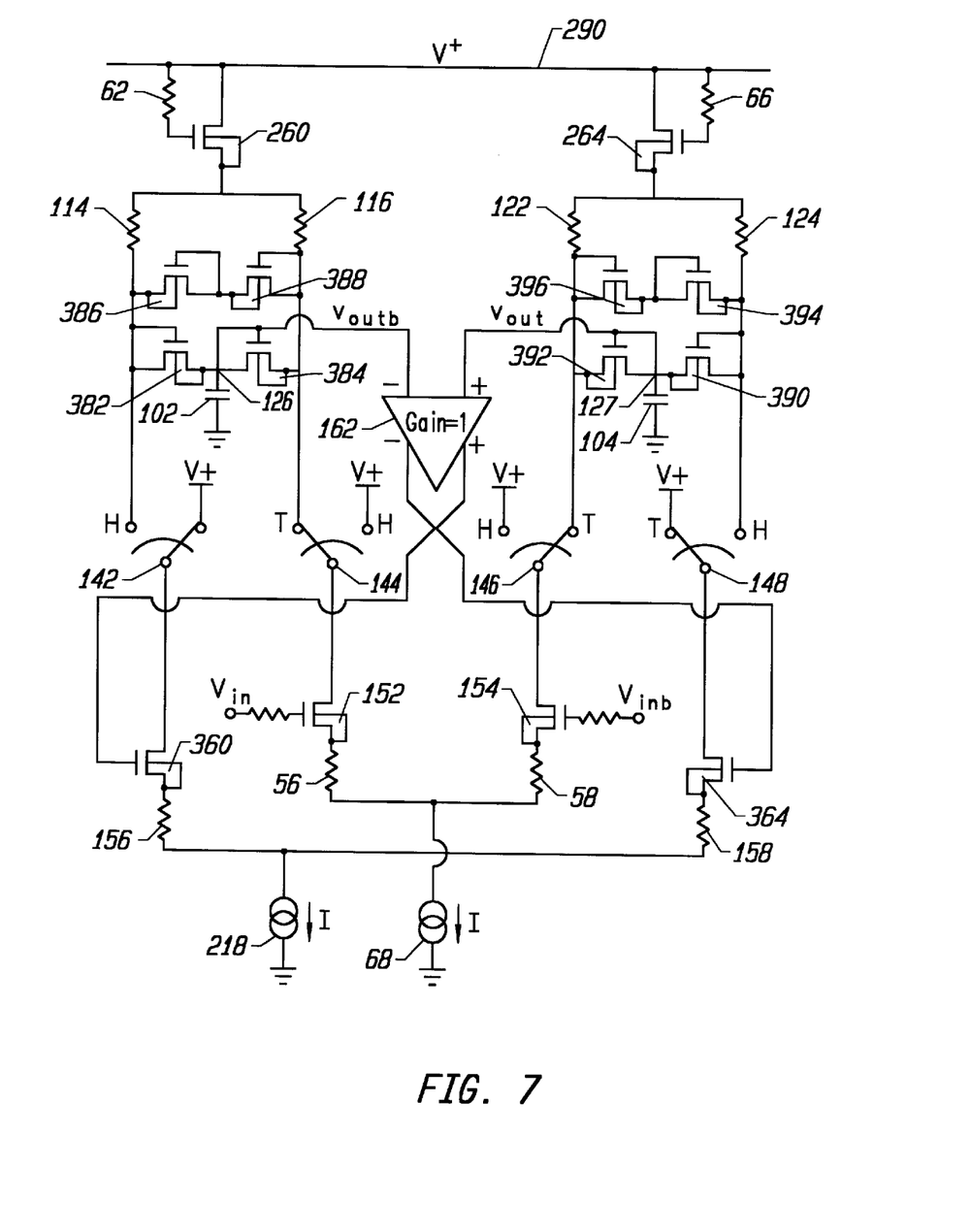
FIG. 7 is a circuit diagram of a complete differential MOSFET track-and-hold circuit according to the invention.

FIG. 7 is a circuit diagram of a complete differential MOSFET track-and-hold circuit 290, according to the invention. The differential MOSFET track-and-hold circuit comprises analogous elements to the differential track-and-hold circuit shown in FIG. 4. All of the descriptions above about the advantages and the function of the invention are also valid in the MOSFET and JFET-implemented circuits.

In the FIG. 7 circuit, all MOSFET's 152, 154, 260, 264, 360, 364, 382, 384, 386, 388, 390, 392, 394, 396 are n-channel enhancement-mode devices. Thus, they require a positive gate-to-source voltage greater than a threshold value to turn them on. If junction diodes are not available in the MOSFET process, the "diode-connected" MOSFET's shown can be used as pass/block devices.

The invention is readily adapted for uses including instrumentation, sound and video production, and analog-to-digital signal conversion. Furthermore, one skilled in the art will readily appreciate that the circuit may also be implemented as a single-ended in and single-ended out configuration. For example, in such single-ended configuration, an operational amplifier can be used to produce a unity gain buffer function and provide the correct voltage offset.

While the preferred embodiment of the invention uses a capacitor as the electrical storage device, one skilled in the art will readily appreciate that any other suitable device may be used to store the output of the differential circuit.

Accordingly, the invention should only be limited by the Claims included below.

I claim:

1. A track and hold circuit responsive to an input voltage, the circuit comprising:

a diode bridge having a first node, a second node, and a third node, the first node being opposite the second node;

a sampling capacitor connected to the third node of the diode bridge;

a first resistor connected between the first node of the diode bridge and a supply voltage;

a second resistor connected between the second node of the diode bridge and the supply voltage, the second resistor being equal in value to the first resistor;

voltage-to-current converting means for generating a first current and a second current in response to the input voltage, the first current, when fed to the first node of the diode bridge generating on the capacitor an output voltage that linearly tracks the input voltage;

switch means, having a track state and a hold state, for selectively connecting the first current and the second current from the voltage-to-current converting means to the diode bridge, the switch means connecting the first current to the first node and dumping the second current in the track state, the switch means dumping the first current and connecting the second current to the second node in the hold state, the second current being equal to the first current during the track mode; and operational amplifier means, coupled to the output voltage, for generating a buffered offset voltage;

wherein said voltage to current converting means operates in response to the buffered offset voltage for generating the second current.

2. The track and hold circuit of claim 1, in which the switch means comprises any of a differential pair, a MOS switch, or a mechanical switch.

3. The track and hold circuit of claim 1, in which the voltage-to-current converting means comprises:

a first transistor having a collector connected to the switch means and having an emitter; and a third resistor connected to the emitter of said first transistor, said third resistor having a value equal to one half of the value of the first resistor.

4. The track and hold circuit of claim 3, in which the first transistor comprises any of a bipolar transistor, a MOSFET, or a JFET device.

5. The track and hold circuit of claim 3, in which:

the track and hold circuit additionally comprises a diode-connected second transistor; and the first resistor and the second resistor are connected to the supply voltage via the diode-connected second transistor.

6. The track and hold circuit of claim 3, in which the track and hold circuit additionally comprises:
   a second transistor having collector, base and emitter electrodes;
   a fourth resistor connected between the collector electrode and the base electrode of the second transistor; and
   the first resistor and the second resistor are connected to the supply voltage via the collector and emitter electrodes of the second transistor.

7. The track and hold circuit of claim 6, in which the fourth resistor has a value such that the collector to emitter voltage drop across the second transistor is equal to the base to emitter voltage drop across the first transistor.

8. A differential track and hold circuit responsive to a differential input voltage, the circuit comprising:
   two diode bridges each having a first node, a second node and a third node, the first node being opposite the second node;
   a capacitor connected to the third node of each diode bridge;
   a first resistor connected between the first node of each diode bridge and a supply voltage;
   a second resistor connected between the second node of each diode bridge and the supply voltage, each second resistor being equal in value to each first resistor;
   voltage-to-current converting means for generating a pair of currents for connection to each diode bridge, each pair of currents being composed of a first current and a second current, the first currents, when respectively fed to the first nodes of the diode bridges, generating between the capacitors a differential output voltage equal to the differential input voltage, said voltage-to-current converting means comprising:
   first and second differential pairs each for generating one of the first currents and one of the second currents in response to the input voltage; each differential pair comprising:
      a first transistor and a second transistor, each transistor having collector, base, and emitter electrodes;
      a third resistor connected to the emitter electrode of the first transistor; and
      a fourth resistor connected to the emitter electrode of the second transistor, the fourth resistor being equal in value to the third resistor; and
   switch means, having a track state and a hold state, for selectively connecting the currents in each pair of currents from the voltage-to-current converting means to one of the diode bridges, the switch means connecting the first current to the first node and dumping the second current in the track state, the switch means dumping the first current and connecting the second current to the second node in the hold state, the second current being equal to the first current during the track mode; and
   operational amplifier means, coupled to the differential output voltage, for generating a buffered offset voltage;
   wherein said voltage to current converting means operates in response to the buffered offset voltage for generating the second current.

9. The differential track and hold circuit of claim 8, in which each differential pair comprises any of a bipolar transistor, a MOSFET, or a JFET device.

10. The differential track and hold circuit of claim 8, in which the differential track and hold circuit additionally comprises:
    a pair of diode-connected transistors; and
    each diode-connected transistor connects one of the first resistors and one of the second resistors to the supply voltage.

11. The differential track and hold circuit of claim 8, in which the circuit additionally comprises:
    an additional pair of transistors, each including a collector, a base, and an emitter electrode;
    a fifth resistor connected between the collector electrode and the base electrode of each transistor in the additional pair of transistors; and
    one of the first resistors and one of the second resistors are connected to the supply voltage via the collector and emitter electrodes one of the transistors in the additional pair of transistors.

12. The differential track and hold circuit of claim 11, in which each fifth resistor has a value such that the collector to emitter voltage drop across each diode-connected transistor is equal to the base to emitter voltage drop across each of the first and second transistors.

13. The differential track and hold circuit of claim 8, in which the switch means comprises any of a differential pair, a MOS switch, or a mechanical switch.

14. A method for reducing distortion in a differential track and hold circuit responsive to a differential input voltage, comprising the steps of:
    providing two diode bridges each having a first node, a second node and a third node, the first node being opposite the second node;
    connecting a capacitor to the third node of each diode bridge;
    connecting a first resistor between the first node of each diode bridge and a supply voltage;
    connecting a second resistor between the second node of each diode bridge and the supply voltage, each second resistor being equal in value to each first resistor;
    generating a pair of currents in response to the differential input voltage for connection to each diode bridge, each pair of currents being composed of a first current and a second current, the first currents, when respectively fed to the first nodes of the diode bridges, generating between the capacitors a differential output voltage equal to the differential input voltage;
    using first and second differential pairs to generate said first current and said second current; each, in response to the input voltage;
    switching between a track state and a hold state to selectively connect one of the currents of each pair of currents to one of the diode bridges, by connecting the first current to the first node and dumping the second current in the track state, and by dumping the first current and connecting the second current to the second node in the hold state, so that the second current is equal to the first current during the track mode; and
    connecting operational amplifier means to the differential output voltage, for generating a buffered offset voltage;
    wherein the second current is output as a result of the buffered offset voltage.

15. The method for reducing distortion in a differential track and hold circuit of claim 14, further comprising the steps of:
    connecting third and fourth resistors, respectively, to the emitter electrodes of first and second transistors, each transistor having collector, base and emitter electrodes, the third and fourth resistors being equal in value; and forming a differential pair by connecting the third and fourth resistors to a common node.

16. The method for reducing distortion in a differential track and hold circuit of claim 15, further comprising the steps of:

generating a pair of currents with first and second differential pairs in response to the input voltage;

providing a pair of transistors, each diode-connected transistor having collector, base and emitter electrodes;

connecting a fifth resistor between the collector electrode and the base electrode of each of the transistors, each fifth resistor having a value such that the collector to emitter voltage drop across each transistor is equal to the base to emitter voltage drop across each of the first and second transistors; and connecting the first resistor and the second resistor to the supply voltage via the collector and emitter electrodes of each transistor.

* * * * *